United States Patent
Guo et al.

(10) Patent No.: US 9,766,814 B2
(45) Date of Patent: Sep. 19, 2017

(54) METHOD AND APPARATUS FOR DEFECT MANAGEMENT IN A NON-VOLATILE MEMORY DEVICE

(71) Applicant: INTEL CORPORATION, Santa Clara, CA (US)

(72) Inventors: Xin Guo, San Jose, CA (US); Feng Zhu, San Jose, CA (US); Eric L. Hoffman, Lafayette, CO (US); Jing-Jing Li, Santa Clara, CA (US); David J. Pelster, Longmont, CO (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/822,793

(22) Filed: Aug. 10, 2015

(65) Prior Publication Data
US 2017/0046073 A1   Feb. 16, 2017

(51) Int. Cl.
*G06F 12/02* (2006.01)
*G06F 3/06* (2006.01)
(Continued)

(52) U.S. Cl.
CPC ............ *G06F 3/0608* (2013.01); *G06F 3/064* (2013.01); *G06F 3/0679* (2013.01); *G06F 12/10* (2013.01);
(Continued)

(58) Field of Classification Search
CPC ............ G06F 12/0246; G06F 12/0238; G06F 12/0646; G06F 3/0679; G06F 3/0619; G06F 3/064; G06F 3/0688; G06F 3/0604; G06F 2212/7201; G06F 2212/7211; G06F 2212/7205; G06F 3/0608; G06F 12/10; G06F 2212/1044; G06F 2212/152; G06F 2212/202; G06F 2212/253; G06F 2212/657; G11C 29/76
See application file for complete search history.

(56) References Cited

U.S. PATENT DOCUMENTS

| 5,862,314 | A | * | 1/1999 | Jeddeloh | ............... G11C 29/76 |
| | | | | | 714/6.13 |
| 6,035,432 | A | * | 3/2000 | Jeddeloh | .............. G11C 29/765 |
| | | | | | 714/710 |

(Continued)

OTHER PUBLICATIONS

International Search Report and Written Opinion for International Application No. PCT/US2016/041654, Oct. 11, 2016, 17 pp. [77.321PCT (ISR & WO)].

*Primary Examiner* — Hiep Nguyen
(74) *Attorney, Agent, or Firm* — David W. Victor; Konrad, Raynes, Davda and Victor LLP

(57) ABSTRACT

Provided are a method and apparatus for remapping logical to physical addresses for a non-volatile memory having dies. Bands extend through the dies and planes in the dies extending through the bands define addressable blocks. A first remapping of a logical-to-physical mapping is performed by remapping logical addresses of blocks in a first end of the bands that map to defective physical blocks to map to good physical blocks at a second end of the bands. After performing the first remapping, a second remapping of the logical-to-physical mapping is performed by remapping logical addresses in the second end of bands that map to defective blocks to map to good physical blocks in the first end of bands.

25 Claims, 10 Drawing Sheets

(51) Int. Cl.
*G06F 12/10* (2016.01)
*G11C 29/00* (2006.01)

(52) U.S. Cl.
CPC ...... *G11C 29/76* (2013.01); *G06F 2212/1044* (2013.01); *G06F 2212/152* (2013.01); *G06F 2212/202* (2013.01); *G06F 2212/253* (2013.01); *G06F 2212/657* (2013.01)

(56) References Cited

U.S. PATENT DOCUMENTS

| | | | |
|---|---|---|---|
| 9,418,700 B2* | 8/2016 | Ramanujan | G11C 29/886 |
| | | | 711/170 |
| 9,430,339 B1* | 8/2016 | Song | G06F 11/1666 |
| | | | 711/170 |
| 2009/0013148 A1* | 1/2009 | Eggleston | G06F 12/0246 |
| | | | 711/203 |
| 2009/0282301 A1* | 11/2009 | Flynn | G06F 11/006 |
| | | | 714/710 |
| 2010/0115376 A1 | 5/2010 | Shalvi et al. | |
| 2010/0228940 A1* | 9/2010 | Asnaashari | G06F 12/0246 |
| | | | 711/170 |
| 2013/0128666 A1 | 5/2013 | Avila et al. | |
| 2014/0164881 A1 | 6/2014 | Chen et al. | |
| 2014/0281687 A1 | 9/2014 | Vogan et al. | |
| 2015/0149818 A1 | 5/2015 | Kalavade et al. | |

* cited by examiner

Logical-to-Physical Mapping

Destination Vector

METHOD AND APPARATUS FOR DEFECT MANAGEMENT IN A NON-VOLATILE MEMORY DEVICE

TECHNICAL FIELD

Embodiments described herein generally relate to a method and apparatus for defect management in a non-volatile memory device.

BACKGROUND

Solid state storage devices (for example, solid state drives) may be comprised of one or more packages of non-volatile memory dies, where each die is comprised of a plurality of bands and planes, such that a band extends across planes in multiple dies. Logical and physical addresses may map to a band, plane, and die. During manufacture, certain of the bands may have defects in less than all the planes of a die through which the band extends. A full plane retirement policy retires logical addresses for all the planes in a band within a die having the bad block. If a bad block is detected in a plane of a band in one die, then the logical addresses in all the planes in that particular die for the band may be retired and not available for use. This may eliminate significant amounts of spare space by eliminating logical addresses mapping to good planes in a band for a die.

There is a need in the art for improved techniques for managing bad blocks in the bands of a memory device.

BRIEF DESCRIPTION OF THE DRAWINGS

Embodiments are described by way of example, with reference to the accompanying drawings, which are not drawn to scale, in which like reference numerals refer to similar elements.

DESCRIPTION OF EMBODIMENTS

Figure 1:
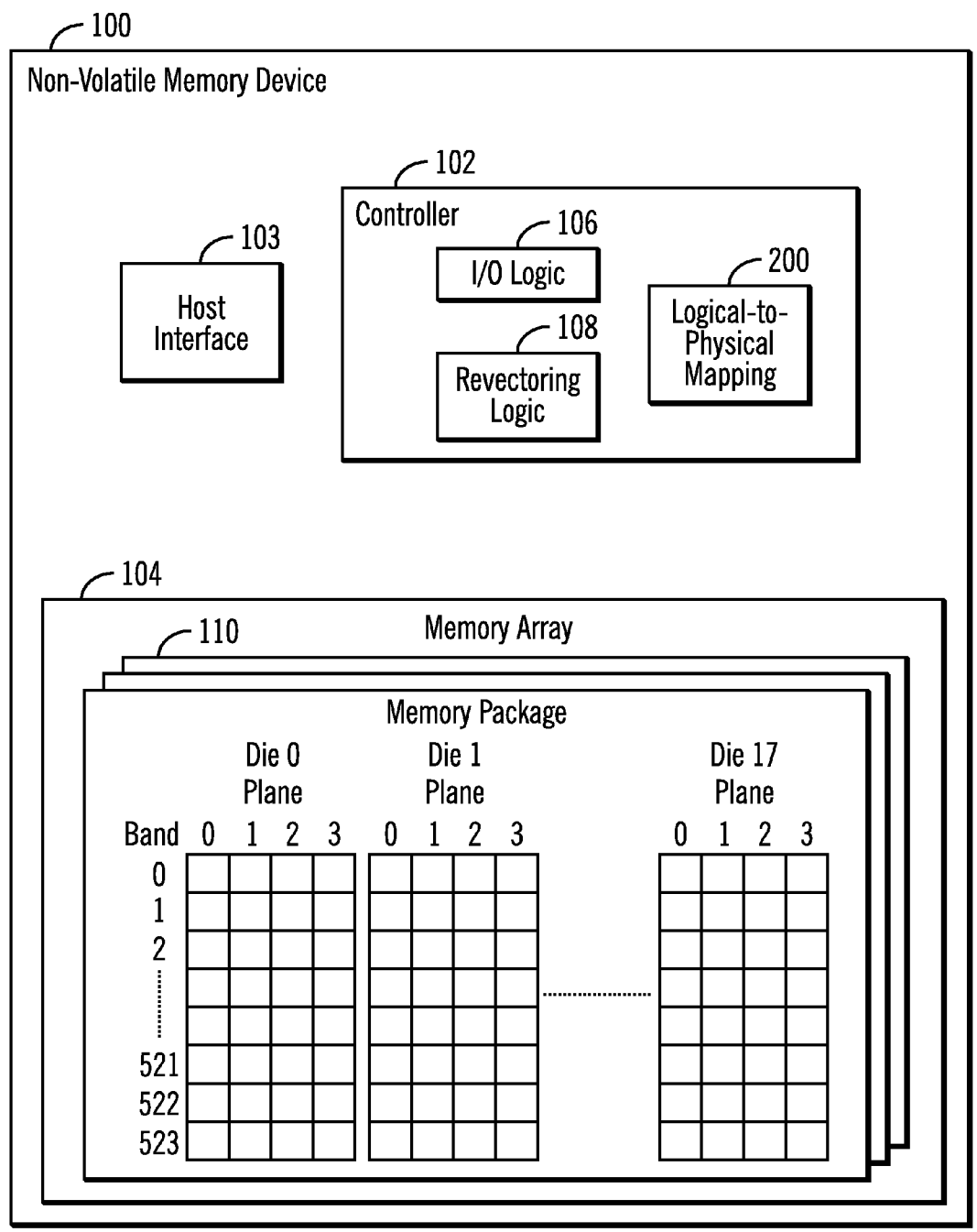
FIG. 1 illustrates an embodiment of a non-volatile memory device.

Non-volatile memory dies are organized into a plurality of bands and planes, such that each die is comprised of planes and each of the bands extends across planes in multiple dies. Logical and physical addresses map to blocks, where each block is addressed by band, plane, and die. Prior art full plane retirement techniques retire all the logical addresses for all the planes in a band when the planes in one of the dies in a band have a bad block. Thus, for full plane retirement, many planes in the band having good blocks are also retired when all the planes in the band are retired.

To reduce the spare space loss that occurs with a full plane retirement policy, described embodiments remap logical addresses in the bands to different physical addresses to allow retirement of planes bands in a manner that minimizes the number of planes in the bands having good physical blocks. With described embodiments, in a first remapping step (also known as revectoring), source logical addresses at a first end of the bands, which extend across the dies, that map to defective physical blocks are remapped (also known as revectored) to the least number of full planes at a second end of the bands, and the destination logical addresses to which the source logical addresses are mapped are indicated as invalid, such as a logical defective block. In a second remapping (also known as revectoring) step, the destination logical addresses of the first step having bad blocks due to the remapping, are redistributed to planes across all the bands at the first end to minimize the number of defective full planes per band, or minimize the number of bad dies in a band. This reduces spare space loss and the number of logical addresses that are lost as a result of retiring bad physical blocks.

Described embodiments provide a two-step revectoring or remapping operation. In a first remapping of the logical-to-physical mapping, logical addresses of blocks in a first end of the bands that map to defective physical blocks are mapped to good physical blocks at a second end of the bands. The logical addresses at the second end that map to blocks to which the logical addresses in the first end were mapped are indicated as bad logical blocks. After performing the first remapping, a second remapping (revectoring) of the logical-to-physical mapping is performed by remapping logical addresses in the second end of bands that map to defective blocks to map to good physical blocks in the first end of bands. In this way, the remapped logical addresses in different dies of a band at the second end of bands are mapped to different destination bands in the first end of bands to distribute the number of bad logical addresses and minimize the number of bad planes in a band.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to storage device electronic assemblies. Embodiments include both devices and methods for forming electronic assemblies.

FIG. 1 illustrates an embodiment of a non-volatile memory device 100 having a controller 102, a host interface 103, and a memory array 104 of non-volatile memory cells. The non-volatile memory device 100 may function as both a memory device and/or a storage device in a computing system, and may be used to perform the role of volatile memory devices and disk drives in a computing system. In an embodiment, the non-volatile memory device 100 may comprise a solid state drive (SSD). The controller 102 includes Input/Output (I/O) logic 106 to manage read and write requests and direct such requests to the memory array 104. The I/O logic 106 adds read/write commands to a command queue (not shown), from which the commands are accessed and executed. A logical-to-physical mapping 200 provides a mapping of logical addresses to which I/O requests are directed and physical addresses in the memory array 104, which as shown may be expressed by band, plane and die. The I/O logic 106 determines the physical address from the logical address included in the I/O request to determine the physical block to which to direct the request. The host interface 103 connects the memory device 100 to a host system when the memory device 100 comprises an SSD. The memory device 100 may be installed or embedded within a host system, such as shown and described with respect to FIG. 9, or the memory device 100 may be external to the host system. The host interface 103 may comprise a bus interface, such as a Peripheral Component Interconnect Express (PCIe) interface, Serial AT Attachment (SATA), Non-Volatile Memory Express (NVMe), etc.

Initially, the logical-to-physical mapping 200 maps each logical address, expressed as a die, band and plane, to the physical address having the same die, band, and plane. Revectoring logic 108 modifies the mapping of logical to physical addresses to redistribute the mapping of logical addresses to bad blocks to minimize the number of defective full planes in every band.

FIG. 1 shows the memory array 104 comprised of one or more memory packages 110, where each package is comprised of a plurality dies, where there are 18 dies 0 . . . 17 in FIG. 1, each die comprised of addressable blocks, each addressable block identified by band and plane in the die. A band, e.g., each of bands 0 . . . 523, comprises a row of blocks extending across all the planes 0, 1, 2, 3 on all the dies 0 . . . 17.

The memory storage array 104 may comprise electrically erasable and non-volatile memory cells, such as flash storage devices. For instance, the memory storage array 104 may comprise NAND dies of memory cells, also known as NAND chips or packages. In one embodiment, the NAND dies may comprise multilevel cell (MLC) NAND flash memories that in each cell records two bit values, a lower bit value and an upper bit value. Alternatively, the NAND dies may comprise single level cell (SLC), multi-level cell (MLC), triple level cell (TLC) NAND memories, etc. The NAND dies, TLC, MLC, SLC, etc., may be organized in a three dimensional (3D) or two dimensional (2D) physical structure. The storage array 104 may also comprise, but is not limited to, MLC NAND flash memory, ferroelectric random-access memory (FeTRAM), nanowire-based non-volatile memory, three-dimensional (3D) crosspoint memory such as phase change memory (PCM), memory that incorporates memristor technology, Magnetoresistive random-access memory (MRAM), Spin Transfer Torque (STT)-MRAM, a single level cell (SLC) Flash memory and other electrically erasable programmable read only memory (EEPROM) type devices.

In one embodiment, the revectoring logic 108 may run in the factory before entering distribution channels in order to remap the logical addresses to physical addresses to minimize the number of bad dies in a band by modifying the mapping of logical addresses to physical addresses to redistribute the logical addresses that map to bad blocks in one band of logical addresses. The memory device 100 performance is improved if the number of bad planes in every band is minimized. The manufacturer may perform the remapping before the shipping of the memory devices 100. Alternatively, users of the memory device 100 may invoke the revectoring logic 108 in the memory device 100 product when reformatting the memory device 100 or during diagnostic and recovery operations. For instance, the revectoring logic 108 may be invoked when the memory device 100 is installed in a computer system and the user invokes the reformatting process using a command interface or a graphical user interface.

Figure 2:
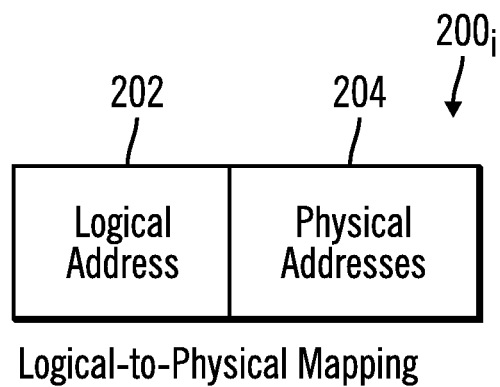
FIG. 2 illustrates an embodiment of a logical-to-physical mapping.

FIG. 2 illustrates an embodiment of an instance of one logical-to-physical mapping $200_i$ in the logical-to-physical mapping 200 that provides a logical address 202, which may be expressed by die, band, and plane, and physical address 204, which may be expressed as die, band, and plane, to which the logical address 202 maps.

Figure 3:
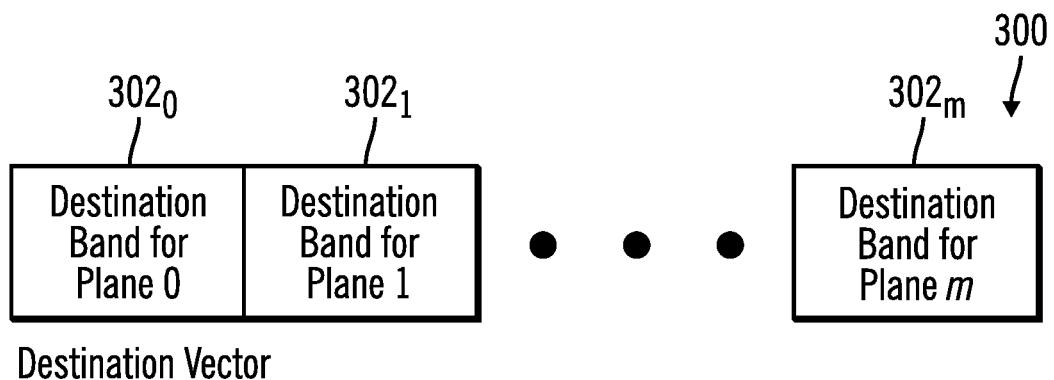
FIG. 3 illustrates an embodiment of a destination vector.

FIG. 3 illustrates an embodiment of a destination vector 300 used during the remapping, also referred to as revectoring, that includes a field $302_0, 302_1 \ldots 302_m$, that provides the destination band for the corresponding plane to which a logical address is remapped.

Figure 4:
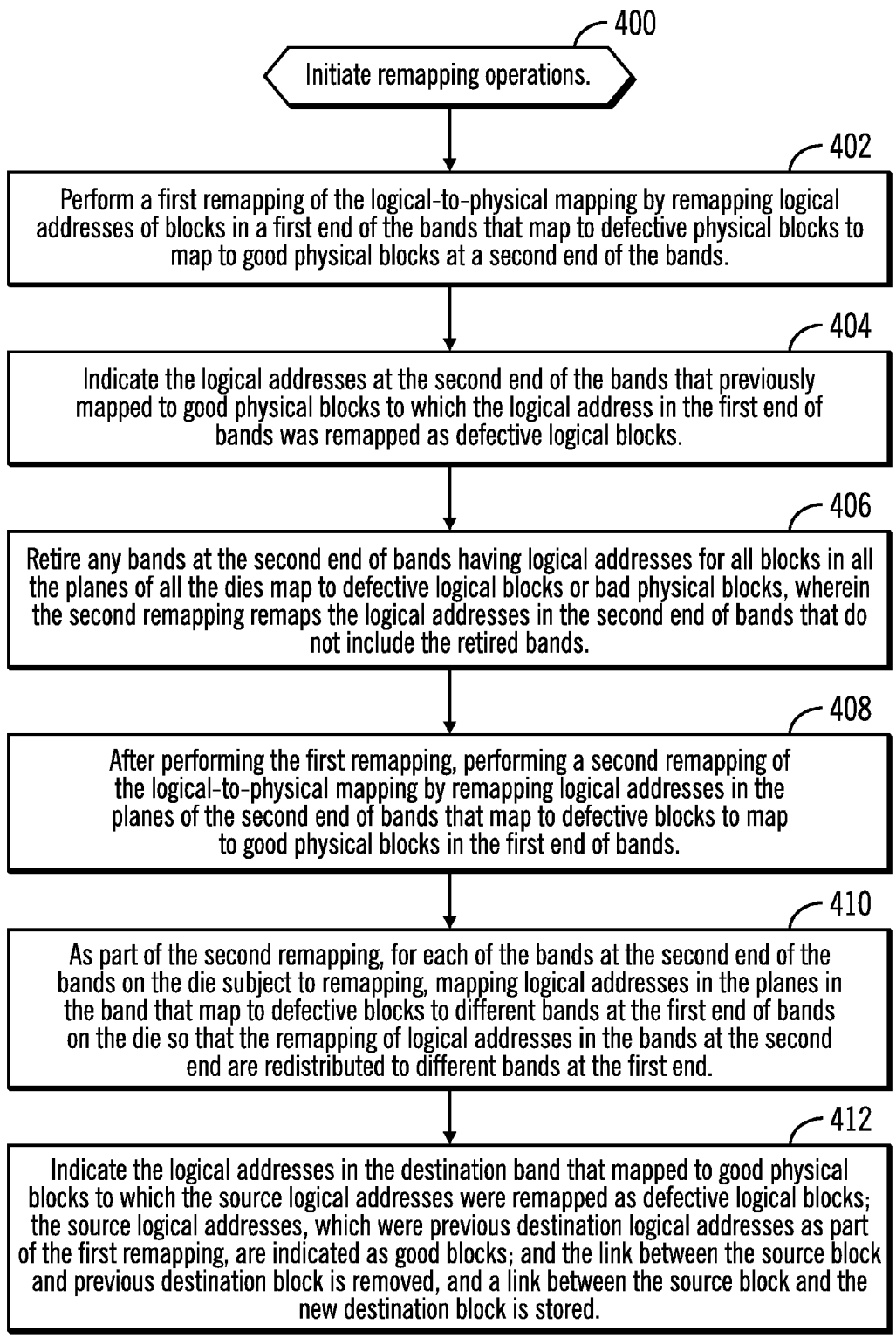
FIG. 4 illustrates an embodiment of operations to perform first and second remappings, i.e., revectorings, of the logical-to-physical mapping.

FIG. 4 illustrates an embodiment of operations performed by the revectoring logic 108 to remap, i.e., revector, the logical to physical addresses to minimize the number of bad planes in a band. The first revectoring or remapping of FIG. 4 remaps bad source logical addresses at a first end of the bands, which may comprise the earlier numbered bands, starting from a beginning band, to the physical blocks at a second end of the bands, i.e., from the last numbered band. In an alternative embodiment, the first end of bands having the source bands m ay comprise the later numbered bands or start from the last numbered band and the second end of bands may start from the beginning band.

Upon initiating the revectoring operations, the revectoring logic 108 performs (at block 402) a first remapping of the logical-to-physical mapping 200 by remapping logical addresses of blocks in a die at a first end of the bands that map to defective physical blocks to map to good physical blocks at a second end of the bands. In one embodiment, the first end of the bands comprises bands from a beginning band, i.e., one of the earlier numbered bands, to a last band of the bands and the second end of the bands comprises bands from the last band to the user start band. In a further embodiment, the first remapping remaps logical addresses from source bands starting sequentially from the beginning band in the first end of bands to destination bands starting sequentially from the last band at the second end of bands while the source band is less than the destination band.

The revectoring logic 108 retires (at block 406) any bands at the second end of bands having logical addresses for all blocks in all the planes of all the dies map to defective logical blocks or bad physical blocks. After performing the first remapping, the logical addresses at the second end that previously mapped to the good physical blocks to which the logical addresses in the first end of bands were remapped are indicated as defective logical blocks. In this way, logical addresses that map to bad blocks are consolidated in the bands at a second end of the bands to consolidate the bad logical addresses at one end of the bands. Any bands at the second end that have all their logical addresses, in all planes and dies of the band, map to defective blocks may be retired.

After performing the first remapping and retiring any bands, the revectoring logic 108 performs (at block 408) a second remapping of the logical-to-physical mapping 200 by remapping logical addresses in the planes at the second end of bands that map to defective blocks to map to good physical blocks in the first end of bands. As part of the second remapping, for each of the bands at the second end of the bands on the die subject to remapping, the revectoring logic maps (at block 410) logical addresses in the planes in the band that map to defective blocks to different bands at the first end of bands on the die so that the remapping of logical addresses in the planes of the band at the second end are redistributed to different bands at the first end of the bands on that same plane. The logical addresses in the destination band that mapped to good physical blocks to which the source logical addresses were remapped are indicated (at block 412) as defective logical blocks; the logical addresses in the destination band that mapped to good physical blocks to which the source logical addresses were remapped are indicated as defective logical blocks; the source logical addresses, which were previous destination logical addresses as part of the first remapping, are indicated as good blocks; and the link between the source block and previous destination block is removed, and a liffl(between the source block and the new destination block is stored.

In one embodiment, the second remapping remaps logical addresses from source bands in a die starting sequentially from one of the bands at the second end not having all defective blocks to destination bands starting sequentially from the first end of the bands from a beginning band while the source band is greater than the destination band. In one embodiment, the second remapping maps the logical addresses in the planes for the source band at the second end on a die that map to bad blocks to different source bands on the same die so that the logical addresses in the band at the second end are remapped to different bands on the first end. In further embodiments, when remapping the logical address at the second end to the first end, the destination logical addresses have the same plane and die. In this way, the second remapping is performed to redistribute the logical addresses in the planes of a band at the second end that address defective blocks to map to good blocks to reduce a number of planes in the band on the die having defective blocks. The logical addresses at the second end subject to remapping may have been indicated as defective as a result of the first remapping.

Figure 5A:
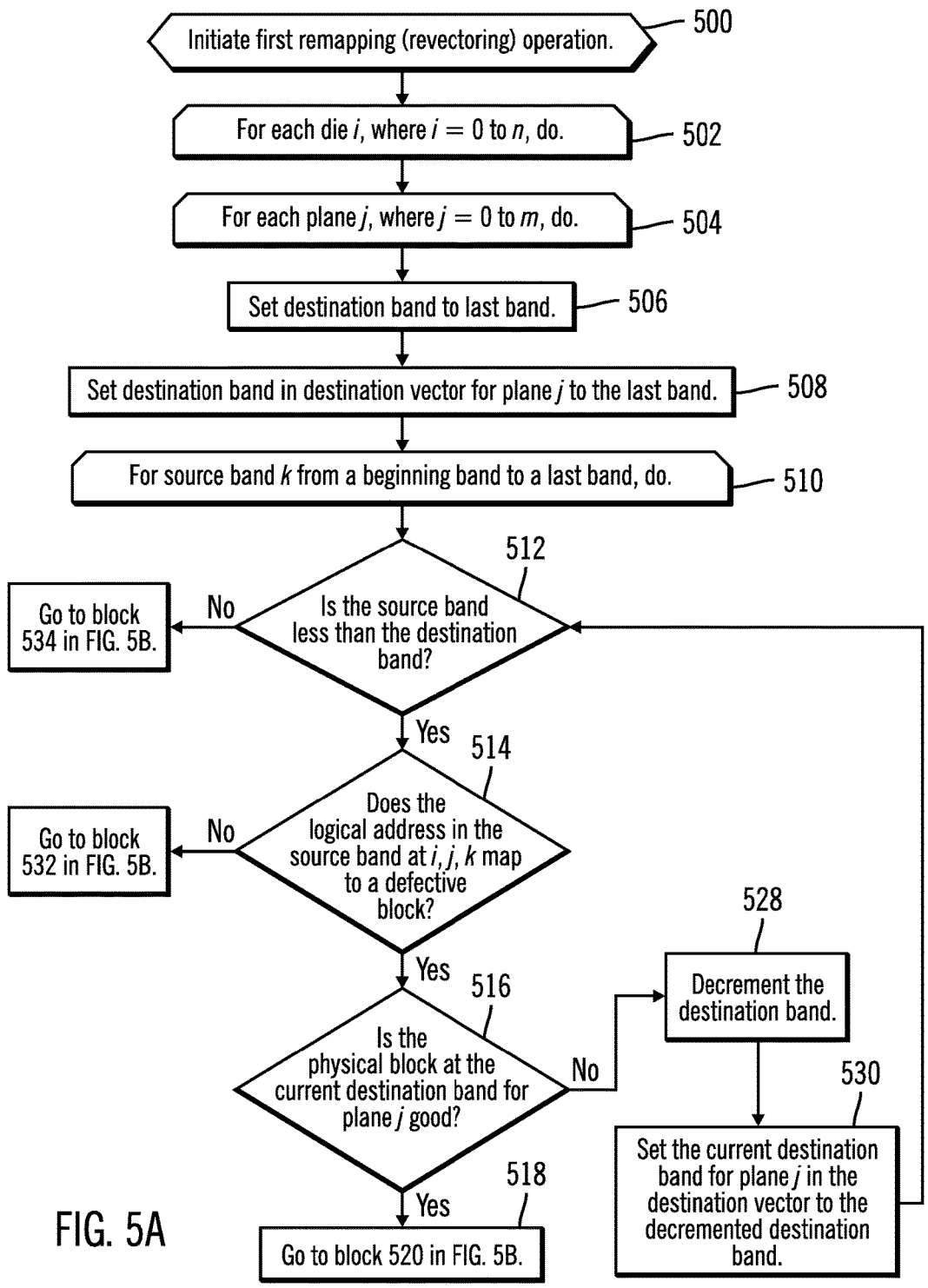
FIGS. 5a and 5b illustrate an embodiment of operations to perform the first remapping of the logical-to-physical mapping or first revectoring.
Figure 5B:
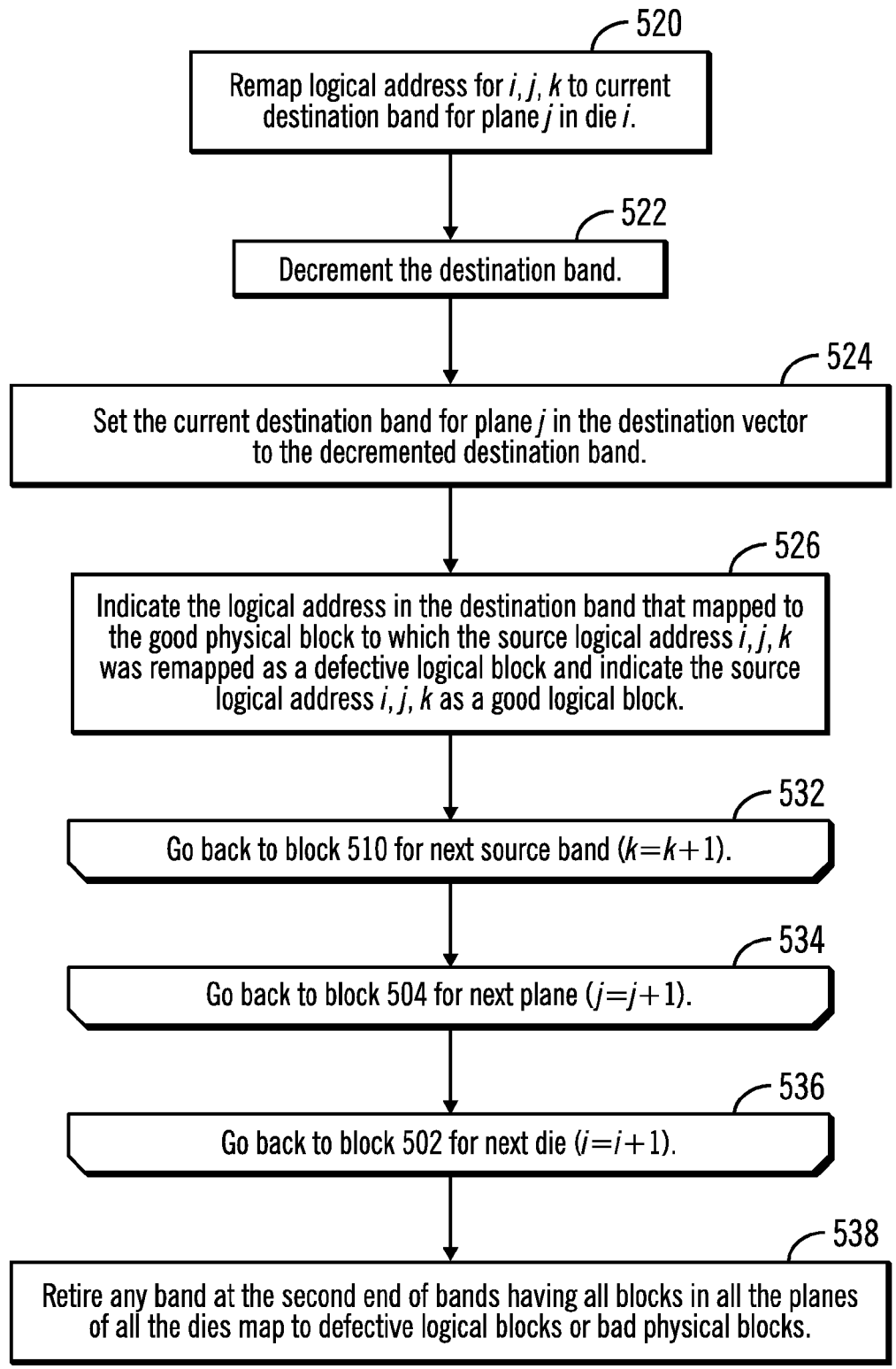

FIGS. 5a and 5b illustrate an embodiment of operations to perform the first remapping of the logical-to-physical mapping, such as performed at blocks 402, 404, and 406 of FIG. 4. The revectoring logic 108 performs a loop of operations at block 502 through 536 for each die i, where i equals 0 to n, where n is the last number die, such as 17 as shown in FIG. 1. For each die i, the revectoring logic 108 performs a loop of operations at blocks 504 through 534, for each plane j, where j can be from 0 to m, where m is shown as three in FIG. 1. The destination band is then set (at block 506) to a last band of the bands, e.g., 523 as shown in FIG. 1, and the destination band $302_j$ in the destination vector 300 for plane j in die i is set to the last band. For each source band k, starting from the beginning band, a loop of operations is performed from blocks 510 to 532 while the source band is greater than the destination band to which the logical address will be remapped.

For source band k, if (at block 512) the source band is less than the destination band, then a determination is made (at block 5143) as to whether the logical address in source band k, plane j and die i maps to a defective physical or logical block. If so, then if (at block 516) the physical block at the current destination band for plane j in die i is good, then control proceeds (at block 518) to block 520 in FIG. 5b where the revectoring logic 508 remaps the logical address for die i, plane j, and source band k to the current destination band for plane j in die i, which may be indicated in the destination vector $302_j$ for plane j. In alternative embodiments, the destination and source blocks can be set in different planes and/or dies. The destination band indicated in the destination vector $302_j$ for plane j is then decremented so the next logical address considered for die i and plane j is mapped to the next destination band. The current destination band for plane $300_j$ indicated in the destination vector 300 is set (at block 524) to the decremented destination band. The revectoring logic 108 may also indicate (at block 526) the logical address in the destination band that mapped to the good physical block to which the source logical address i, j, k was remapped as a defective logical block and indicate the source logical address i, j, k as a good logical block. Thus, a defective logical address (or block) comprises a logical address that no longer maps to a specific physical block and a defective physical block comprises a physical block on one die that cannot be accessed due to damage.

If (at block 512) the source band is not less than the destination band, then control proceeds to block 534 in FIG. 5b to process blocks in source bands for the next plane. If (at block 514) the logical address in the source band at die i, plane j, and source band k do not map to a defective block, then there is no need to remap the logical address and control proceeds to block 532 in FIG. 5b to process the next source band for die i and plane j. If (at block 516) the physical block at the current destination band for plane j is not good, meaning the logical address at the source band k cannot be remapped to a bad physical block, then the destination band is decremented (at block 528) and the current destination band $300_j$ for plane j in the destination vector 300 is set (at block 530) to the decremented destination band. In this way, source logical addresses in one plane that map to bad physical blocks are mapped to good physical blocks in different bands of the same plane.

After processing all possible source logical addresses for all the dies, planes, and bands, to consolidate logical addresses pointing to bad blocks in the last bands, the revectoring logic 108 retires (at block 538) any band at the second end of bands having all blocks in all the planes of all the dies map to defective logical blocks or bad physical blocks.

Figure 6:
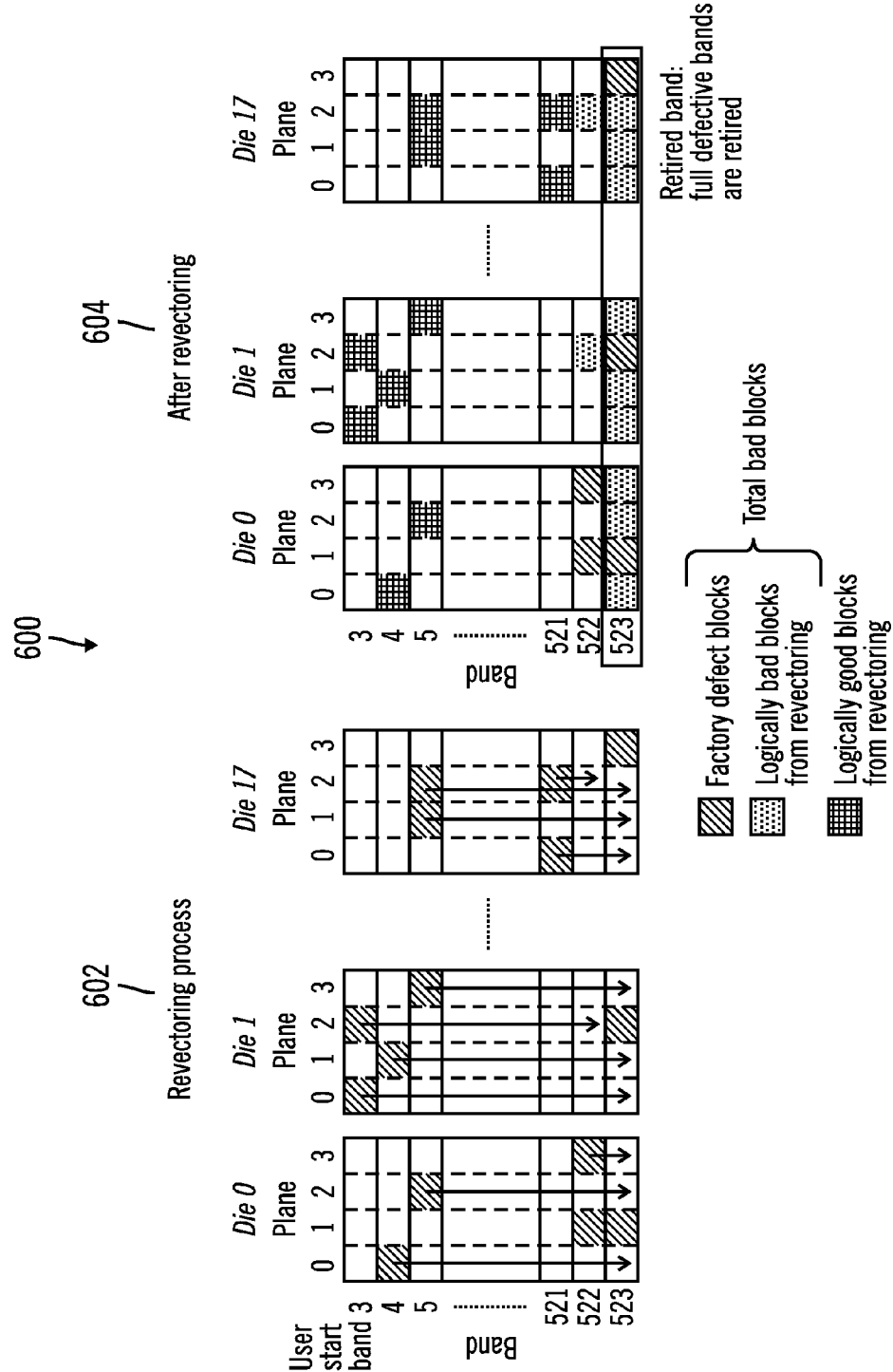
FIG. 6 illustrates an example of how the first remapping is performed to remap logical addresses in upper bands of the dies to lower bands.

FIG. 6 illustrates an example of the first mapping of FIGS. 4, 5a and 5b. The first revector process 602 shows arrows of logical addresses initially mapped to bad factory blocks that are remapped to good physical blocks in the same plane but on bands at the lower ends of b ands. The after revectoring 604 results of the first remapping or revectoring shows the band 523 having all factory defective or logical defective blocks as being retired. The square hatched boxes in the upper band show logical addresses remapped and the diagonal hashed boxes in band 523 shows logical addresses that are defective or do not point to a valid physical block. In this way, logical addresses in the upper bands that map to defective blocks are remapped to good blocks in the lower bands to consolidate the bad logical addresses in the lower band.

Figure 7A:
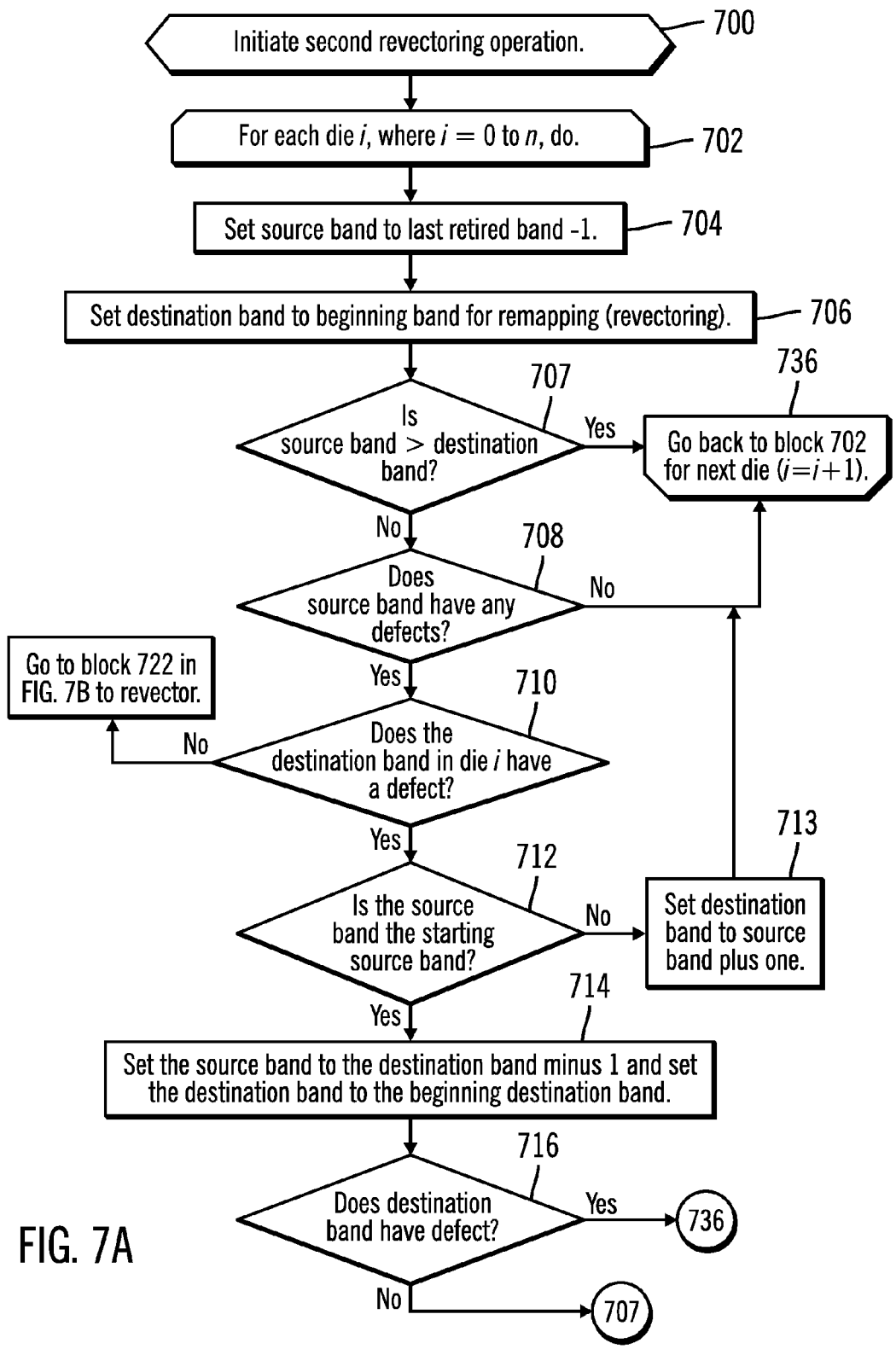
FIGS. 7a and 7b illustrate an embodiment of operations to perform the second remapping of the logical-to-physical mapping or second revectoring.
Figure 7B:
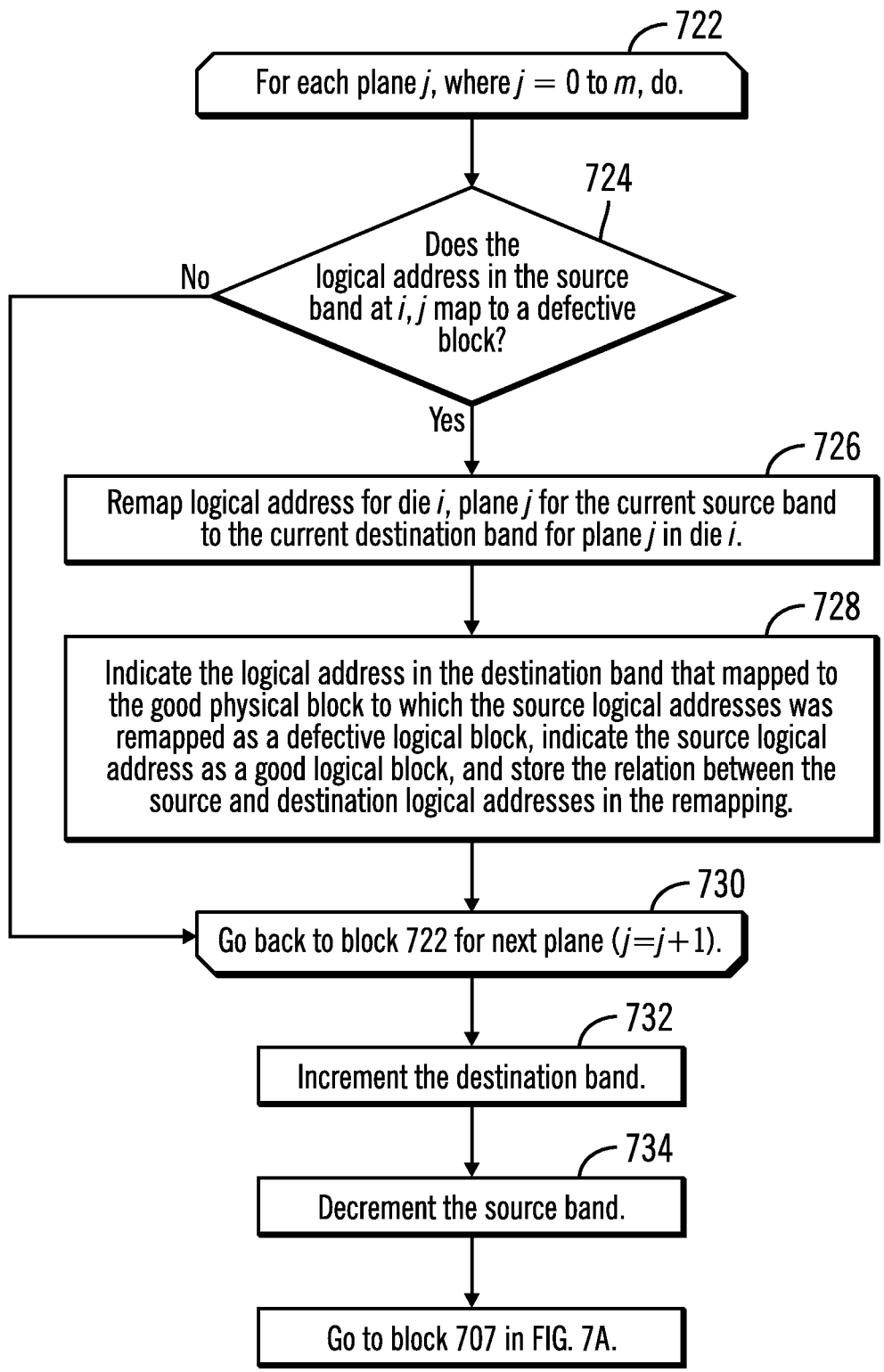

FIGS. 7a and 7b illustrate an embodiment of operations to perform the second remapping (revectoring) of the logical-to-physical mapping, such as performed at blocks 408 and 410 of FIG. 4. Upon initiating (at block 700) the second revectoring operation, after performing the first revectoring operation of FIGS. 5a and 5b, a loop of operations is performed at blocks 702 through 736 for each die i, where i equals 0 to n, where n is the last number die, such as 17 as shown in FIG. 1. The revectoring logic 108 sets (at block 704) the source band to the last retired band minus one, so that the revectoring starts from the last source band preceding any retired bands. The destination band is set (at block 706) to the beginning band, which may be a user selected start band or default value of one of the earlier number bands.

If (at block 707) the source band is not greater than the destination band and if (at block 708) the source band does not have any defects, then a determination is made (at block 710) as to whether the source band in die i has a defect. If so and if (at block 712) the source band is the beginning band, then the source band is set (at block 714) to the destination band minus one and the destination band is set to a beginning destination band, such as the beginning band at the first end of bands. If revectoring has not started on die i, i.e., the source band is the beginning band, then the destination band may be defective due to an overlap of the destination bands on the previous die and the source bands on this die. By setting the source band to the destination band minus one, the source band on the current die i after the destination band on the previous die (i-1) will not be revectored in order to have only one defective die per band. Then for the rest of the source bands on this die i, the destination bands start over from the beginning band. If (at block 716) the destination band is still defective, then control proceeds to block 736 to perform the second revectoring (remapping) for the next die because there is no defect free band on the current die i. Otherwise, if (from the no branch of block 716) the destination band is not defective, then control proceeds back to block 707 to make sure the source band remains greater than the destination band in order to proceed with the remapping.

If (from the yes branch of block 707) the source band is greater than the destination band or if (at block 708) the source band does not have any defects, then control proceeds to block 736 to consider the next die i. If (at block 712) the source band is the starting band when the destination band in die i has a defect, then the revectoring logic 108 sets (at block 713) the destination band to the source band plus one and proceeds to block 736 to process the next die i. The situation at block 713 occurs when the source band and destination band meet in the middle, and in such case revectoring stops for the rest of the source bands in die i. If (from the yes branch of block 708 and the no branch of block 710) the source band has defects and the destination band does not, then control proceeds to block 722 in FIG. 7b to initiate revectoring.

Upon initiating revectoring at block 722, the revectoring logic 108 performs a loop of operations at blocks 722 through 730 (FIG. 7b), for each plane j, where j can be from 0 to m, where m is shown as three in FIG. 1. If (at block 724) the logical address in the source band in die i and plane j maps to a defective block, then the logical address at die i, plane j, and the current source band is remapped (at block 726) to the current destination band for plane j and die i. The logical address in the destination band that mapped to the good physical block to which the source logical addresses was remapped is indicated (at block 728) as a defective logical block, the source logical address is indicated as a good logical block, and the relation between the source and destination logical addresses subject to the remapping is stored. If (at block 724) the logical address in the source band is not defective, then control proceeds to block 730 to consider the logical address in the next plane in the source band in die i. After remapping any logical addresses mapping to defective blocks in the planes of the current source band and die i to the destination band, the destination band is incremented (at block 732), the source band is decremented (at block 734), and control proceeds back to block 707 in FIG. 7a to perform the remapping for the next source band and destination band in die i.

The described operations of FIGS. 7a and 7b remap logical addresses in the planes of a current source band in a die i to a new destination band to redistribute any bad logical addresses in the planes in one band on the die to different destination bands on the die to minimize the number of defective full planes in every band of the die. In the second revectoring, the defects in the non-retired full planes of every die are revectored again to make the least number of defective full planes in every band. In this way, the defective full planes are spread across all the available bands of the die to reduce the number of runt bands in the die with a large number of defective full planes. Runt bands in a die comprise bands having a large number of defective planes.

Figure 8:
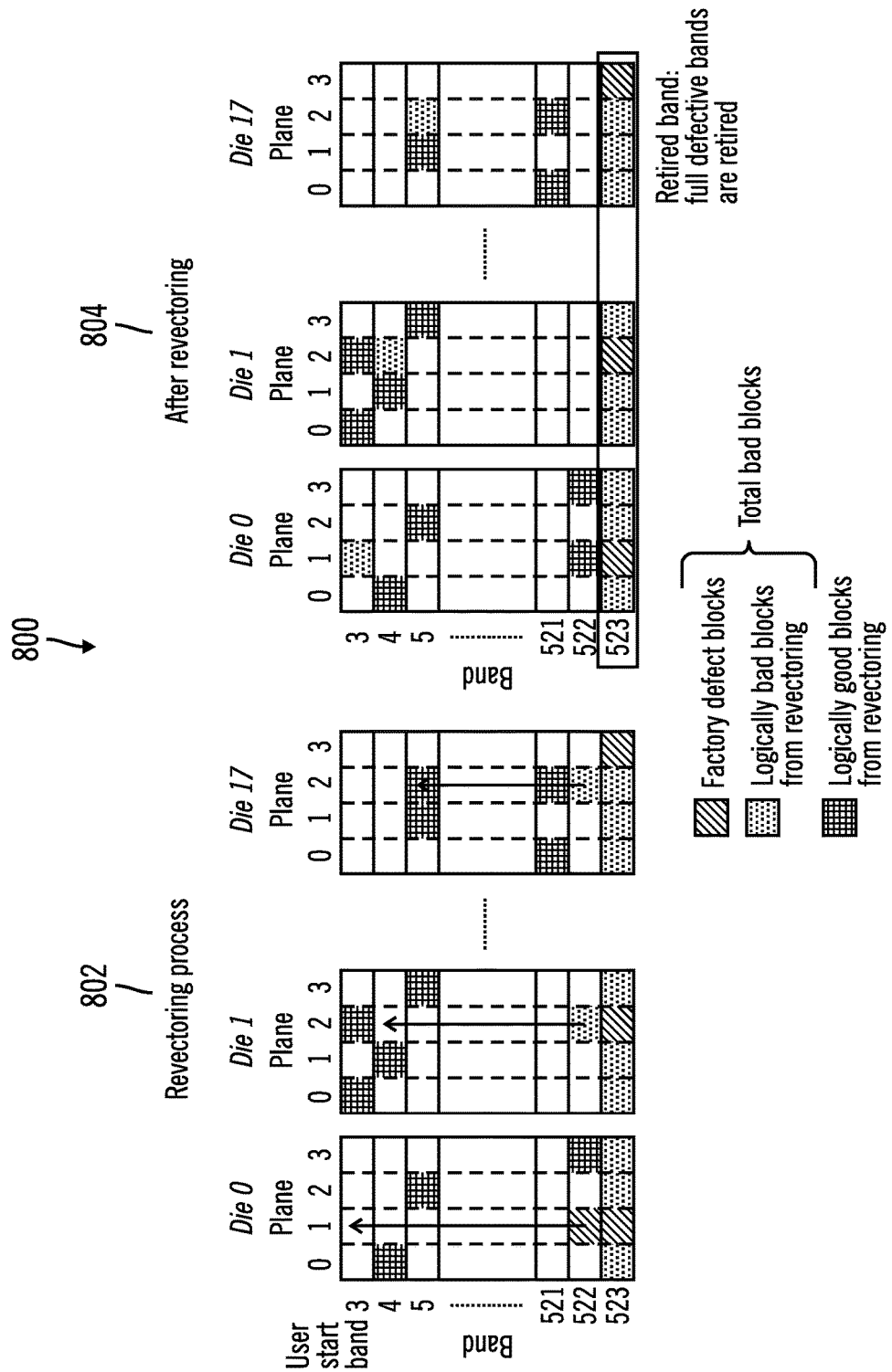
FIG. 8 illustrates an example of how the second remapping is performed to remap logical addresses in lower bands of the dies to upper bands.

FIG. 8 illustrates an example of the second revectoring (remapping) operation, i.e., revectoring of FIGS. 4, 7a, 7b, and 8b. The second revectoring process 802 shows arrows of logical addresses in the lower bands that have not been retired that map to bad logical or physical blocks being remapped to good physical blocks in the same plane but on bands at the upper bands. In this way, bad logical addresses in the planes of the lower bands are remapped to good physical addresses in the upper bands to redistribute the logical addresses in the lower bands to minimize the number of defective full planes across all available bands. The after revectoring 804 results of the second remapping or revectoring shows the logical addresses in the band 522 above the retired band 523 mapping to good physical addresses when previously they mapped to bad logical or physical blocks. However, the logical addresses in the upper bands that addressed the good blocks to which the logical addresses in the lower bands were remapped are shown as logically bad blocks, such as the logical addresses in band 3, plane 1, die 0; band 4, plane 2, die 1; and band 5, plane 2, die 17. The square hatched boxes in the lower band show logical addresses remapped to good physical blocks and the diagonal hashed boxes in bands 3, 4, and 5 show logical addresses that are defective or do not point to a valid physical block as a result of the remapping. In this way, the defective full planes from the first die to the last die are sequentially remapped to the destination bands starting from the beginning band to the last non-retired band. If all the aforementioned destination bands are filled, the destination bands start over again from the user start band to revector the following defective full planes. The reduction of runt bands, bands with a large number of defective full planes on its dies, improves the performance and reduces the drive-to-drive variation of write time.

The described first and second revectoring (remapping) provides specific operations to first remap logical addresses having bad blocks in bands at a first end of bands to physical addresses at a second end of the bands having good blocks in the same plane and then redistribute the bad logical addresses at the second end of bands among bands at the first end. In alternative embodiments, different techniques may be used to map logical addresses in the first and second mapping into different planes and dies to accomplish the goals of grouping bad logical addresses into bands at one end, so that the bands may be retired, and then redistributing bad logical addresses at the second or lower end into bands at the first upper end on different dies, so as to minimize the number of defective full planes in a band on the dies.

Figure 9:
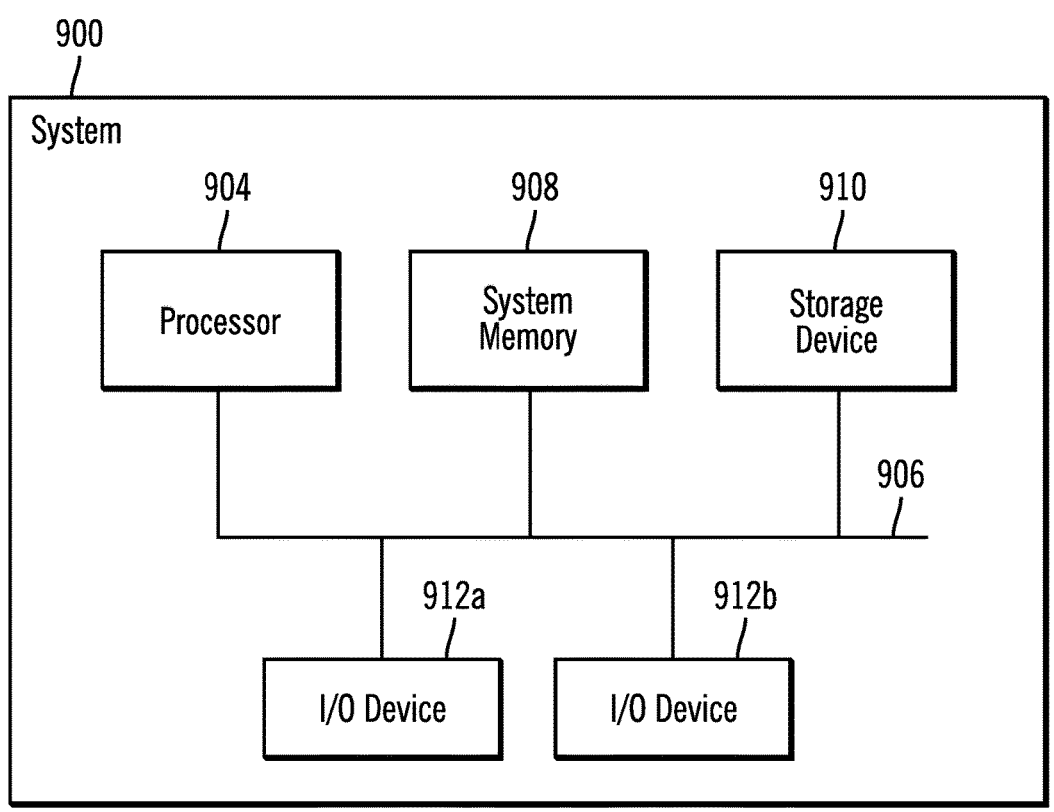
FIG. 9 illustrates a system in which the memory device of FIGS. 1 may be deployed.

FIG. 9 illustrates an embodiment of a system 900 in which the memory device 100 may be deployed as the system memory device 908 and/or a storage device 910. The system includes a processor 904 that communicates over a bus 906 with a system memory device 908 in which programs, operands and parameters being executed are cached, and a storage device 910, which may comprise a solid state drive (SSD) that stores programs and user data that may be loaded into the system memory 908 for execution. The processor 904 may also communicate with Input/Output (I/O) devices 912a, 912b, which may comprise input devices (e.g., keyboard, touchscreen, mouse, etc.), display devices, graphics cards, ports, network interfaces, etc. The memory 908 and storage device 910 may be coupled to an interface on the system 800 motherboard, mounted on the system 800 mother board, or deployed in an external memory device or accessible over a network.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

EXAMPLES

The following examples pertain to further embodiments.

Example 1 is an apparatus, comprising: a non-volatile memory having dies, wherein bands extend through the dies, and planes in the dies extending through the bands define addressable blocks; and memory control logic; and a logical-to-physical mapping to provide a mapping of logical addresses of blocks to physical addresses of blocks in the dies, wherein the logical to physical mapping is formed by the memory control logic performing a first remapping of the logical-to-physical mapping by remapping logical addresses of blocks in a first end of the bands that map to defective physical blocks to map to good physical blocks at a second end of the bands and to perform a second remapping of the logical-to-physical mapping after performing the first remapping by remapping logical addresses in the second end of bands that map to defective blocks to map to good physical blocks in the first end of bands.

In Example 2, the subject matter of Examples 1 and 3-10 can optionally include that the logical-to-physical mapping is further formed by the memory control logic further performing: in response to performing the first remapping of the logical-to-physical mapping, indicate as defective logical blocks the logical addresses at the second end of the bands that previously mapped to the good physical blocks to which the logical addresses in the first end of bands was remapped.

In Example 3, the subject matter of Examples 1, 2 and 4-10 can optionally include that the logical-to-physical mapping is further formed by the memory control logic further performing: retire at least one band at the second end of bands having all blocks in all the planes of all the dies whose logical addresses map to defective logical blocks and/or bad physical blocks, wherein the second remapping remaps the logical addresses in the second end of bands that do not include the retired bands.

In Example 4, the subject matter of Examples 1-3 and 5-10 can optionally include that the second remapping remaps the logical addresses to different bands at the first end of bands to redistribute the logical addresses in the band at the second end to different bands at the first end.

In Example 5, the subject matter of Examples 1-4 and 6-10 can optionally include that the second remapping remaps the logical addresses in the planes of the bands on one die to different destination bands on the die to provide a least number of defective full planes in every band.

In Example 6, the subject matter of Examples 1-5 and 7-10 can optionally include that the second remapping further indicates the logical addresses in the destination band that mapped to good physical blocks to which the source logical addresses were remapped as a defective logical block.

In Example 7, the subject matter of Examples 1-6 and 8-10 can optionally include that the first end of the bands comprises bands from a beginning band to a last band of the bands and wherein the second end of the bands comprises bands from the last band to the beginning band.

In Example 8, the subject matter of Examples 1-7, 9, and 10 can optionally include that the first remapping remaps logical addresses from source bands starting sequentially from the beginning band in the first end of the bands to destination bands starting sequentially from the last band at the second end of the bands while the source band is less than the destination band.

In Example 9, the subject matter of Examples 1-8 and 10 can optionally include that the second remapping remaps logical addresses from source bands starting sequentially from one of the bands at the second end not having all defective blocks to destination bands starting sequentially from the first end of the bands starting sequentially from the beginning band while the source band is greater than the destination band.

In Example 10, the subject matter of Examples 1-9 can optionally include that the second remapping further comprises: in response to the source band beginning at a starting source band and the destination band having a defect, set the source band to the destination band minus one and set the destination band to a beginning destination band, and then performing the second remapping with respect to the set source band and the destination band.

Example 11 is a method for configuring non-volatile memory having dies, wherein bands extend through the dies, and planes in the dies extending through the bands define addressable blocks, comprising: performing a first remapping of a logical-to-physical mapping by remapping logical addresses of blocks in a first end of the bands that map to defective physical blocks to map to good physical blocks at a second end of the bands; and after performing the first remapping, performing a second remapping of the logical-to-physical mapping by remapping logical addresses in the second end of bands that map to defective blocks to map to good physical blocks in the first end of bands.

In Example 12, the subject matter of Example 11 can optionally include at least one step of:

(1) wherein the logical-to-physical mapping is further formed by the memory control logic further performing: in response to performing the first remapping of the logical-to-physical mapping, indicate as defective logical blocks the logical addresses at the second end of the bands that previously mapped to the good physical blocks to which the logical addresses in the first end of bands was remapped; and/or (2) wherein the logical-to-physical mapping is further formed by the memory control logic further performing: retire at least one band at the second end of bands having all blocks in all the planes of all the dies whose logical addresses map to defective logical blocks and/or bad physical blocks, wherein the second remapping remaps the logical addresses in the second end of bands that do not include the retired bands; and/or (3) wherein the second remapping remaps the logical addresses to different bands at the first end of bands to redistribute the logical addresses in the band at the second end to different bands at the first end; and/or (4) wherein the second remapping remaps the logical addresses in the planes of the bands on one die to different destination bands on the die to provide a least number of defective full planes in every band; and/or (5) wherein the second remapping further indicates the logical addresses in the destination band that mapped to good physical blocks to which the source logical addresses were remapped as a defective logical block; and/or (6) wherein the first end of the bands comprises bands from a beginning band to a last band of the bands and wherein the second end of the bands comprises bands from the last band to the beginning band; and/or (7) wherein the first remapping remaps logical addresses from source bands starting sequentially from the beginning band in the first end of the bands to destination bands starting sequentially from the last band at the second end of the bands while the source band is less than the destination band; and/or (8) wherein the second remapping remaps logical addresses from source bands starting sequentially from one of the bands at the second end not having all defective blocks to destination bands starting sequentially from the first end of the bands starting sequentially from the beginning band while the source band is greater than the destination band; and/or (9) wherein the second remapping further comprises: in response to the source band beginning at a starting source band and the destination band having a defect, set the source band to the destination band minus one and set the destination band to a beginning destination band, and then performing the second remapping with respect to the set source band and the destination band.

Example 13 is a memory controller coupled to a non-volatile memory having dies, wherein bands extend through the dies, and planes in the dies extending through the bands define addressable blocks, comprising: memory control logic that when executed performs operations, the operations comprising: perform a first remapping of a logical-to-physical mapping by remapping logical addresses of blocks in a first end of the bands that map to defective physical blocks to map to good physical blocks at a second end of the bands; and after performing the first remapping, perform a second remapping of the logical-to-physical mapping by remapping logical addresses in the second end of bands that map to defective blocks to map to good physical blocks in the first end of bands.

In Example 14, the subject matter of Examples 13 and 15-17 can optionally include that the second remapping remaps the logical addresses to different bands at the first end of bands to redistribute the logical addresses in the band at the second end to different bands at the first end.

In Example 15, the subject matter of Examples 13, 14, 16, and 17 can optionally include that the second remapping remaps the logical addresses in the planes of the bands on one die to different destination bands on the die to provide a least number of defective full planes in every band.

In Example 16, the subject matter of Examples 13-15 and 17 can optionally include that the first end of the bands comprises bands from a beginning band to a last band of the bands and wherein the second end of the bands comprises bands from the last band to the beginning band, and wherein the first remapping remaps logical addresses from source bands starting sequentially from the beginning band in the first end of the bands to destination bands starting sequentially from the last band at the second end of the bands while the source band is less than the destination band.

In Example 17, the subject matter of Examples 13-16 can optionally include that the first end of the bands comprises bands from a beginning band to a last band of the bands and wherein the second end of the bands comprises bands from the last band to the beginning band, and wherein the second remapping remaps logical addresses from source bands starting sequentially from one of the bands at the second end not having all defective blocks to destination bands starting sequentially from the first end of the bands starting sequentially from the beginning band while the source band is greater than the destination band.

Example 18 is an apparatus for configuring non-volatile memory having dies, wherein bands extend through the dies, and planes in the dies extending through the bands define addressable blocks, comprising: means for performing a first remapping of a logical-to-physical mapping by remapping logical addresses of blocks in a first end of the bands that map to defective physical blocks to map to good physical blocks at a second end of the bands; and means for performing the first remapping, performing a second remapping of the logical-to-physical mapping by remapping logical addresses in the second end of bands that map to defective blocks to map to good physical blocks in the first end of bands.

In Example 19, the subject matter of Example 18 can optionally include means for indicating as defective logical blocks the logical addresses at the second end of the bands that previously mapped to the good physical blocks to which the logical addresses in the first end of bands was remapped in response to performing the first remapping of the logical-to-physical mapping.

Example 20 is an apparatus comprising means to perform a method as claimed in any preceding claim.

Example 21 is a machine-readable storage including machine-readable instructions, when executed, to implement a method or realize an apparatus or system as claimed in any preceding claim.

What is claimed:

1. An apparatus, comprising:
   a non-volatile memory having dies, wherein bands extend through the dies, and planes in the dies extending through the bands define addressable blocks, wherein the bands are numbered to extend from a first end to a second end in an array of the bands;
   memory controller; and
   a logical-to-physical mapping to provide a mapping of logical addresses of blocks to physical addresses of blocks in the dies, wherein the memory controller forms the logical-to-physical mapping and performs:
      a first remapping of the logical-to-physical mapping to remap logical addresses of blocks from a first remapping source band that maps to bad physical blocks to map to good physical blocks at a first remapping destination band, wherein the first remapping source band is closer to the first end than the first remapping destination band and the first remapping destination band is closer to the second end than the first remapping source band; and
      a second remapping of the logical-to-physical mapping after performing the first remapping to map logical addresses that map to bad physical blocks in a second remapping source band to good physical blocks at a second remapping destination band, wherein the second remapping source band is closer to the second end than the second remapping destination band and the second remapping destination band is closer to the first end than the second remapping source band.

2. The apparatus of claim 1, wherein the logical-to-physical mapping is further formed by the memory controller to:
   in response to performing the first remapping of the logical-to-physical mapping, indicate as bad logical blocks the logical addresses at the first remapping destination band that previously mapped to the good physical blocks to which the logical addresses in the first remapping destination band was remapped.

3. The apparatus of claim 2, wherein the logical-to-physical mapping is further formed by the memory controller to:
   retire at least one band at the second end of bands having all blocks in all the planes of all the dies whose logical addresses map to bad logical blocks and/or bad physical blocks, wherein the second remapping remaps the logical addresses in the first remapping destination band that does not include one of the retired bands.

4. The apparatus of claim 1, wherein the second remapping remaps the logical addresses in the second remapping source band to different second remapping destination bands at the first end of bands to redistribute the logical addresses in the second remapping source band at the second end to different second remapping destination bands at the first end.

5. The apparatus of claim 4, wherein the second remapping remaps the logical addresses in planes of second remapping source bands on one die to different second remapping destination bands on the die to provide a least number of defective full planes in every band.

6. The apparatus of claim 5, wherein the second remapping further indicates the logical addresses in the second remapping destination band that mapped to good physical blocks, to which the logical addresses in the second remapping source band were remapped, as a bad logical block.

7. The apparatus of claim 1, wherein the bands are numbered from a first number sequentially through a last number, wherein the first end of the bands begins at the first number and wherein the second end of the bands begins at a band having the last number.

8. The apparatus of claim 7, wherein the first remapping remaps logical addresses from first remapping source bands that start sequentially from a band having the first number to first remapping destination bands that start sequentially from the band having the last number at the second end of the bands while the first remapping source band is closer to the first end than the first remapping destination band.

9. The apparatus of claim 7, wherein the second remapping remaps logical addresses from second remapping source bands that start sequentially from one of the bands at the second end not having all bad blocks, to destination bands that start sequentially from the first end of the bands starting sequentially from band having the first number while the second remapping source band is greater than the second remapping destination band.

10. The apparatus of claim 1, wherein the second remapping further comprises the memory controller to:
    in response to the second remapping source band beginning at a starting source band and the second remapping destination band having a defect, set the second remapping source band to the second remapping destination band minus one and set the second remapping destination band to a beginning destination band, and then performing the second remapping with respect to the set second remapping source band and the second remapping destination band.

11. A method for configuring non-volatile memory having dies, wherein bands extend through the dies, and planes in the dies extending through the bands define addressable blocks, wherein the bands are numbered to extend from a first end to a second end in an array of the bands, comprising:
    performing a first remapping of a logical-to-physical mapping to remap logical addresses of blocks from a first remapping source band that maps to bad physical blocks to map to good physical blocks at a first remapping destination band, wherein the first remapping source band is closer to the first end than the first remapping destination band and the first remapping destination band is closer to the second end than the first remapping source band; and
    after performing the first remapping, performing a second remapping of the logical-to-physical mapping to map logical addresses that map to bad physical blocks in a second remapping source band to good physical blocks at a second remapping destination band, wherein the second remapping source band is closer to the second end than the second remapping destination band and the second remapping destination band is closer to the first end than the second remapping source band.

12. The method of claim 11, further comprising:
    in response to performing the first remapping of the logical-to-physical mapping, indicating as bad logical blocks the logical addresses at the first remapping destination band that previously mapped to the good physical blocks to which the logical addresses in the first remapping destination band was remapped.

13. The method of claim 12, further comprising:
    retiring at least one band at the second end of bands having all blocks in all the planes of all the dies whose logical addresses map to defective logical blocks and/or bad physical blocks, wherein the second remapping remaps the logical addresses in the first remapping destination band that does not include one of the retired bands.

14. The method of claim 11, wherein the second remapping remaps the logical addresses to different second remapping destination bands at the first end of the bands to redistribute the logical addresses in the second remapping source band at the second end to different second remapping destination bands at the first end.

15. The method of claim 14, wherein the second remapping remaps the logical addresses in planes of second remapping source bands on one die to different second remapping destination bands on the die to provide a least number of defective full planes in every band.

16. The method of claim 15, wherein the second remapping further indicates the logical addresses in the second remapping destination band that mapped to good physical blocks to which the logical addresses in the second remapping source band were remapped as a bad logical block.

17. The method of claim 11, wherein the first end of the bands comprises bands from a beginning band to a last band of the bands and wherein the second end of the bands comprises bands from the last band to the beginning band.

18. The method of claim 17, wherein the first remapping remaps logical addresses from first remapping source bands that start sequentially from the beginning band in the first end of the bands to first remapping destination bands that start sequentially from the last band at the second end of the bands while the first remapping source band is less than the first remapping destination band.

19. The method of claim 17, wherein the second remapping remaps logical addresses from source bands that start sequentially from one of the bands at the second end not having all bad blocks to destination bands that start sequentially from the first end of the bands starting sequentially from the beginning band while the source band is greater than the destination band.

20. The method of claim 11, wherein the second remapping further comprises:
in response to the second remapping source band beginning at a starting source band and the second remapping destination band having a defect, setting the second remapping source band to the second remapping destination band minus one and set the second remapping destination band to a beginning destination band, and then performing the second remapping with respect to the set second remapping source band and the second remapping destination band.

21. A memory controller coupled to a non-volatile memory having dies, wherein bands extend through the dies, and planes in the dies extending through the bands define addressable blocks, wherein the bands are numbered to extend from a first end to a second end in an array of the bands, comprising:
memory control logic configured to:
perform a first remapping of a logical-to-physical mapping to remap logical addresses of blocks from a first remapping source band that maps to bad physical blocks to map to good physical blocks at a first remapping destination band, wherein the first remapping source band is closer to the first end than the first remapping destination band and the first remapping destination band is closer to the second end than the first remapping source band; and
after performing the first remapping, perform a second remapping of the logical-to-physical mapping to map logical addresses that map to bad physical blocks in a second remapping source band to good physical blocks at a second remapping destination band, wherein the second remapping source band is closer to the second end than the second remapping destination band and the second remapping destination band is closer to the first end than the second remapping source band.

22. The memory controller of claim 21, wherein the second remapping remaps the logical addresses to different second remapping destination bands at the first end of bands to redistribute the logical addresses in the second remapping source band at the second end to different second remapping destination bands at the first end.

23. The memory controller of claim 22, wherein the second remapping remaps the logical addresses in planes of second remapping source bands on one die to different second remapping destination bands on the die to provide a least number of defective full planes in every band.

24. The memory controller of claim 21, wherein the first end of the bands comprises bands from a beginning band to a last band of the bands and wherein the second end of the bands comprises bands from the last band to the beginning band, and wherein the first remapping remaps logical addresses from first remapping source bands that start sequentially from the beginning band in the first end of the bands to first remapping destination bands that start sequentially from the last band at the second end of the bands while the first remapping source band is less than the first remapping destination band.

25. The memory controller of claim 21, wherein the first end of the bands comprises bands from a beginning band to a last band of the bands and wherein the second end of the bands comprises bands from the last band to the beginning band, and wherein the second remapping remaps logical addresses from second remapping source bands that start sequentially from one of the bands at the second end not having all bad blocks to second remapping destination bands that start sequentially from the first end of the bands starting sequentially from the beginning band while the second remapping source band is greater than the second remapping destination band.

* * * * *